(12) United States Patent
Chung et al.

(10) Patent No.: US 8,455,984 B2
(45) Date of Patent: Jun. 4, 2013

(54) INTEGRATED CIRCUIT STRUCTURE AND METHOD OF FORMING THE SAME

(75) Inventors: Kee Wei Chung, Taipei County (TW); Chiang Hung Lin, Taipei County (TW); Neng Tai Shih, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 333 days.

(21) Appl. No.: 12/946,445

(22) Filed: Nov. 15, 2010

(65) Prior Publication Data

US 2012/0119355 A1    May 17, 2012

(51) Int. Cl.
*H01L 29/40* (2006.01)
*H01L 23/48* (2006.01)
*H01L 23/52* (2006.01)

(52) U.S. Cl.
USPC .... 257/621; 257/737; 257/774; 257/E23.011; 257/E23.021; 257/E23.067; 257/E23.069

(58) Field of Classification Search
USPC .................. 438/667, 672, 977, 613; 257/621, 257/737, E21.584, E21.585, E21.597, E21.508, 257/E23.011, E23.021, E23.067, E23.069
See application file for complete search history.

(56) References Cited

U.S. PATENT DOCUMENTS

| | | | |
|---|---|---|---|
| 6,864,172 B2 * | 3/2005 | Noma et al. | 438/674 |
| 2006/0205211 A1 * | 9/2006 | Kirby | 438/667 |
| 2007/0045780 A1 * | 3/2007 | Akram et al. | 257/621 |
| 2009/0174947 A1 * | 7/2009 | Hasegawa | 359/642 |
| 2011/0316140 A1 * | 12/2011 | Nalla et al. | 257/698 |
| 2011/0316147 A1 * | 12/2011 | Shih et al. | 257/737 |
| 2012/0056315 A1 * | 3/2012 | Chang et al. | 257/737 |
| 2012/0289062 A1 * | 11/2012 | Lo et al. | 438/782 |

OTHER PUBLICATIONS

Kurita et al., "A 3D stacked memory integrated on a logic device using SMAFTI technology," Electronic Components and Technology Conference, 2007, pp. 821-829.

* cited by examiner

*Primary Examiner* — Charles Garber
*Assistant Examiner* — Ron Pompey
(74) *Attorney, Agent, or Firm* — Hamre, Schumann, Mueller & Larson, P.C.

(57) ABSTRACT

A method of forming an integrated circuit structure comprises the steps of: providing a semiconductor substrate having a first side and a second side opposite the first side; forming a hole extending from the first side of the semiconductor substrate into the semiconductor substrate; filling the hole with conductive material; thinning the second side of the semiconductor substrate to a first predetermined thickness, so that the bottom of the hole does not protrude from the second side of the semiconductor substrate; and etching the second side of the semiconductor substrate to a second predetermined thickness, thereby exposing the bottom of the hole.

4 Claims, 10 Drawing Sheets

INTEGRATED CIRCUIT STRUCTURE AND METHOD OF FORMING THE SAME

TECHNICAL FIELD

The present invention relates to an integrated circuit structure and a method of forming the same. More particularly, the present invention relates to an integrated circuit structure having a through-silicon via (TSV) and a method of forming the same.

BACKGROUND

Packaging technology for integrated circuit structures has been continuously developed to meet the demand toward miniaturization and mounting reliability. Recently, as the miniaturization and high functionality of electric and electronic products are required, various techniques have been disclosed in the art.

By using a stack of at least two chips, in the case of a memory device for example, it is possible to produce a product having a memory capacity which is twice as large as that obtainable through semiconductor integration processes. Also, a stack package provides advantages not only of an increase in memory capacity but also in regards to mounting density and mounting area utilization efficiency. Due to this fact, research and development of stack package technology has accelerated.

As an example of a stack package, a through-silicon via (TSV) has been disclosed in the art. The stack package using a TSV has a structure in which the TSV is disposed in a chip so that chips are physically and electrically connected with each other through the TSV. Generally, a TSV is formed by etching a vertical via through a substrate and filling the via with a conductive material, such as copper. To increase the transmission speed and for high-density fabrication, the thickness of a semiconductor wafer comprising multiple integrated circuit structures each having the TSV should be reduced efficiently.

However, in order to reduce the thickness of the wafer and form the TSV in the corresponding integrated circuit structure, the deposition of a silicon nitride (SiN) layer on the backside of the wafer and multiple chemical mechanical polishing (CMP) process are required in the prior art process, which is complex and expensive. An example is described in an article entitled "A 3D Stacked Memory Integrated on a Logic Device Using SMAFTI Technology" by Yoichiro Kurita, et al., ECTC 2007 Electronic Components and Technology Conference paper, pages 821 to 829. Therefore, there is a need to provide a novel TSV backside process to reduce manufacturing complexity and cost.

SUMMARY

An aspect of the present invention is to provide an integrated circuit structure having a through-silicon via and a method of forming the same.

According to one embodiment of the present invention, the method of forming an integrated circuit structure comprises the steps of providing a semiconductor substrate having a first side and a second side opposite the first side; forming a hole extending from the first side into the semiconductor substrate; filling the hole with conductive material; thinning the second side of the semiconductor substrate to a first predetermined thickness, so that the bottom of the hole does not protrude from the second side of the semiconductor substrate; and etching the second side of the semiconductor substrate to a second predetermined thickness, thereby exposing the bottom of the hole.

According to another embodiment of the present invention, the integrated circuit structure comprises a semiconductor substrate having a first side and a second side opposite the first side, a conductive via extending from the first side of the semiconductor substrate, a photosensitive dielectric layer with an opening formed on the second side of the semiconductor substrate, and a solder bump positioned in the opening and electrically connected to the conductive via.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes as those of the present invention. It should also be realized by those skilled in the art that such equivalent constructions do not depart from the spirit and scope of the invention as set forth in the appended claims.

BRIEF DESCRIPTION OF THE DRAWINGS

The accompanying drawings, which are incorporated in and constitute a part of this specification, illustrate embodiments of the disclosure and, together with the description, serve to explain the principles of the invention.

DETAILED DESCRIPTION

Figure 1:
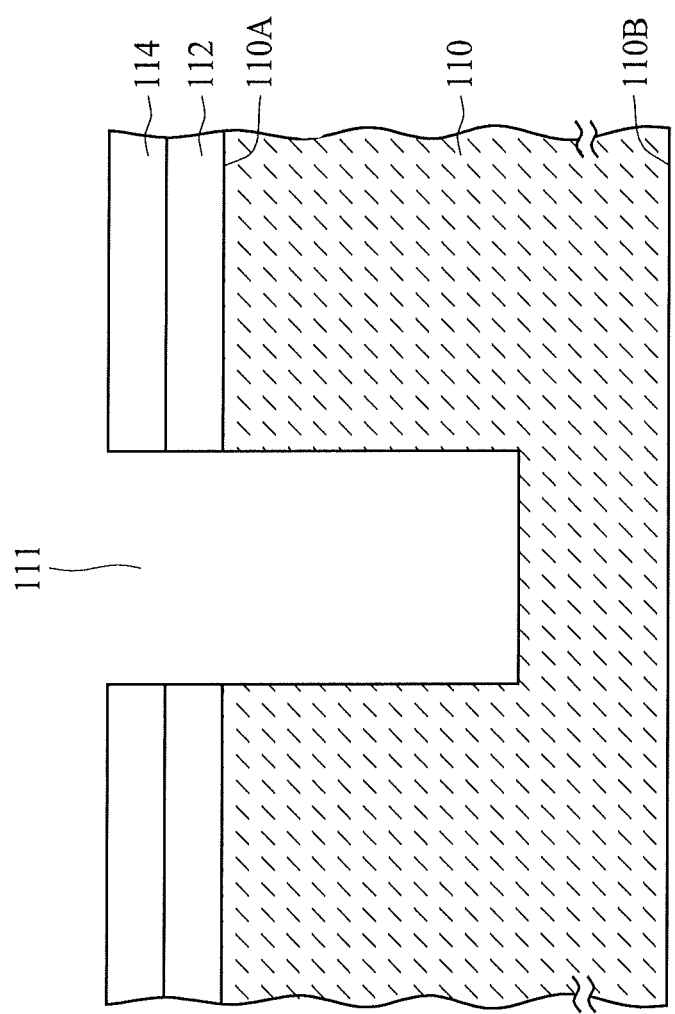
FIGS. 1 through 10 are cross-sectional views illustrating a method for forming an integrated circuit structure in accordance with one embodiment of the present invention.

FIGS. 1 through 10 are cross-sectional views illustrating a method for forming an integrated circuit structure 10 in accordance with one embodiment of the present invention. Referring to FIG. 1, a semiconductor substrate 110 has a first side 110A and a second side 110B opposite the first side 110A, and an inter-layer dielectric (ILD) layer 112 is formed on the first side 110A of the semiconductor substrate 110. The ILD layer 112 may be formed, for example, of a low-K dielectric material, such as phosphosilicate glass (PSG), borophosphosilicate glass (BPSG) or fluorinated silicate glass (FSG). One or more inter-metal dielectric (IMD) layers 114 are formed over the ILD layer 112 to interconnect electrical devices (not shown) to communicate with each other. The IMD layers 114 are preferably formed of a low-K dielectric material. In one embodiment of the present invention, photolithographic and etching processes are performed to form one or more holes 111 extending from the IMD layers 114 into the semiconductor substrate 110.

Figure 2:
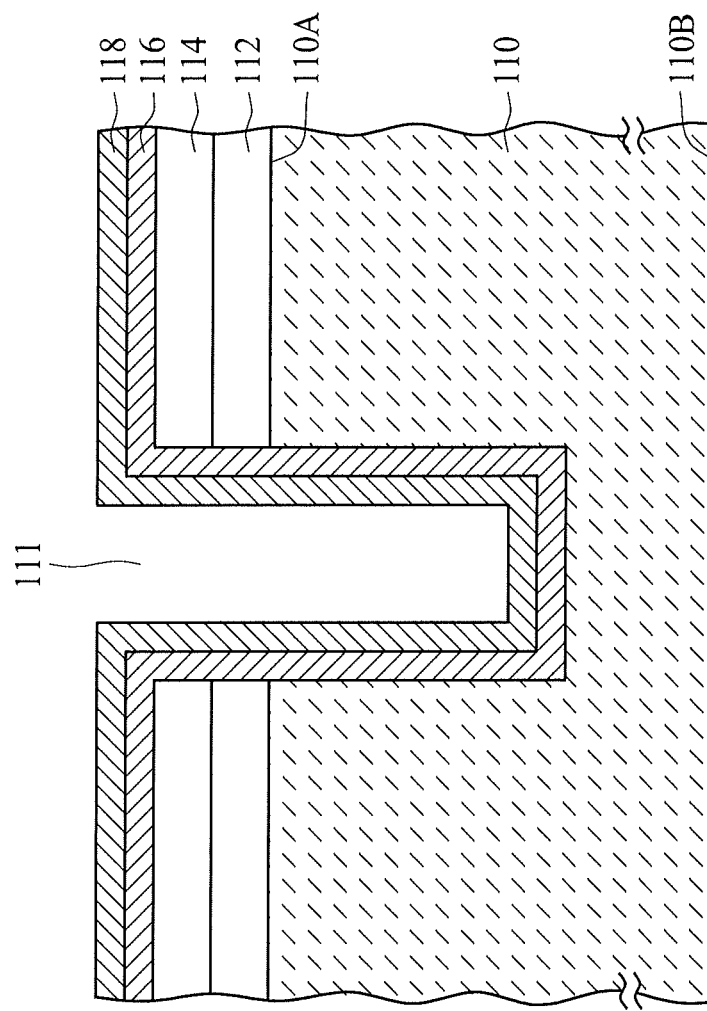

Referring to FIG. 2, a dielectric layer 116 such as an oxide layer is formed along the sidewall and bottom surface of the hole 111 by a conventional deposition method and a conductive diffusion barrier layer 118 is then formed along the dielectric layer 116. The conductive diffusion barrier layer 118 could be made of a material selected from the group consisting of TaN, Ta, TiN, Ti, Co, W, and a combination thereof.

Figure 3:
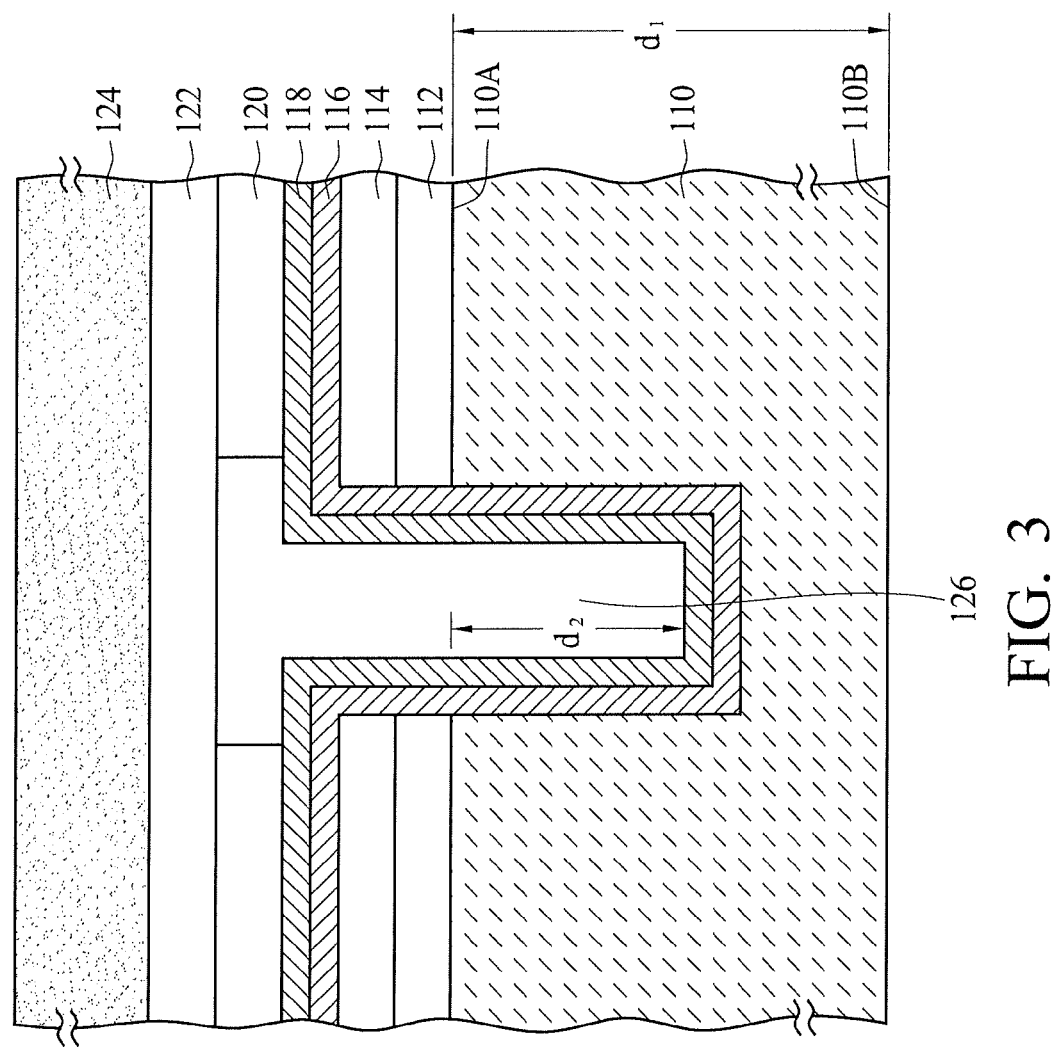

Referring to FIG. 3, a protective layer 120, such as a polyimide layer, may be formed and patterned over the surface of the diffusion barrier layer 118. Subsequently, the hole 111 is filled with a conductive material, thereby forming a TSV 126.

The conductive material of the TSV 126 can be made of a material selected from the group consisting of copper, tungsten, aluminum, silver and a combination thereof. It should be noted that the ILD layer 112, IMD layer 114, and protective layer 120 are illustrated as being arranged successively for illustrative purposes only and that other arrangements may be utilized.

Referring to FIG. 3, a carrier 124 is attached to the integrated circuit structure 10 by using an adhesive 122. The adhesive 122 may be any suitable adhesive, such as ultraviolet (UV) glue. Generally, the carrier 124 provides temporary mechanical and structural support during subsequent processing steps. In this manner, damage to the semiconductor substrate 110 can be reduced or prevented. In one embodiment of the present invention, the thickness $d_1$ of the semiconductor substrate 110 is originally between 700 μm and 800 μm, and the depth $d_2$ of the TSV 126 extending from the first side 110A of the semiconductor substrate 110 is originally about 55 μm.

Figure 4:
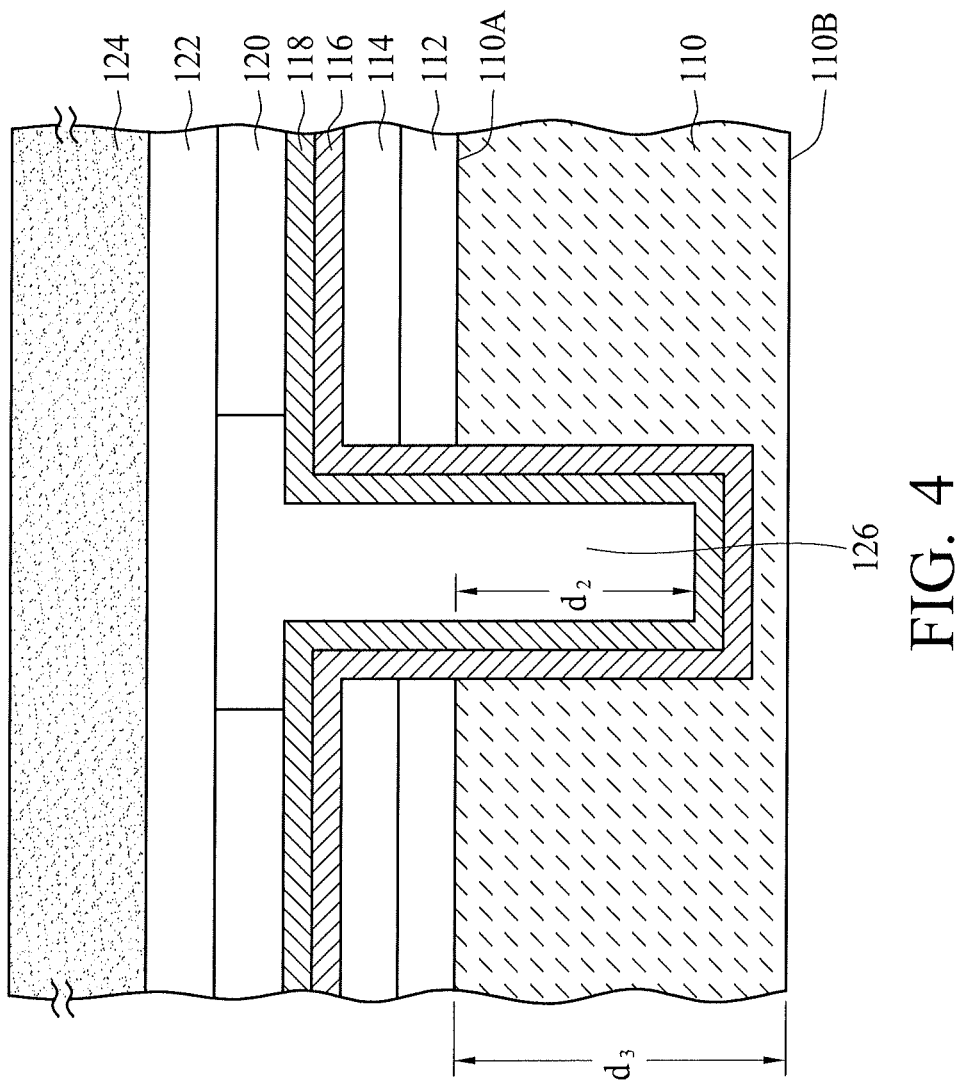

FIG. 4 illustrates a thinning process performed on the second side 110B of the semiconductor substrate 110 in accordance with an embodiment of the present invention. The thinning process may be performed using a planarization process, such as a mechanical grinding process or a chemical mechanical polishing (CMP) process, and the thickness of the semiconductor substrate 110 is decreased to a first predetermined thickness $d_3$ after the process. In one embodiment of the present invention, after the thinning process, the new thickness $d_3$ of the semiconductor substrate 110 is, preferably, between 55.5 μm and 60 μm to prevent the bottom of the hole 111 (the dielectric layer 116) from exposing outside the second side 110B of the semiconductor substrate 110.

Figure 5:
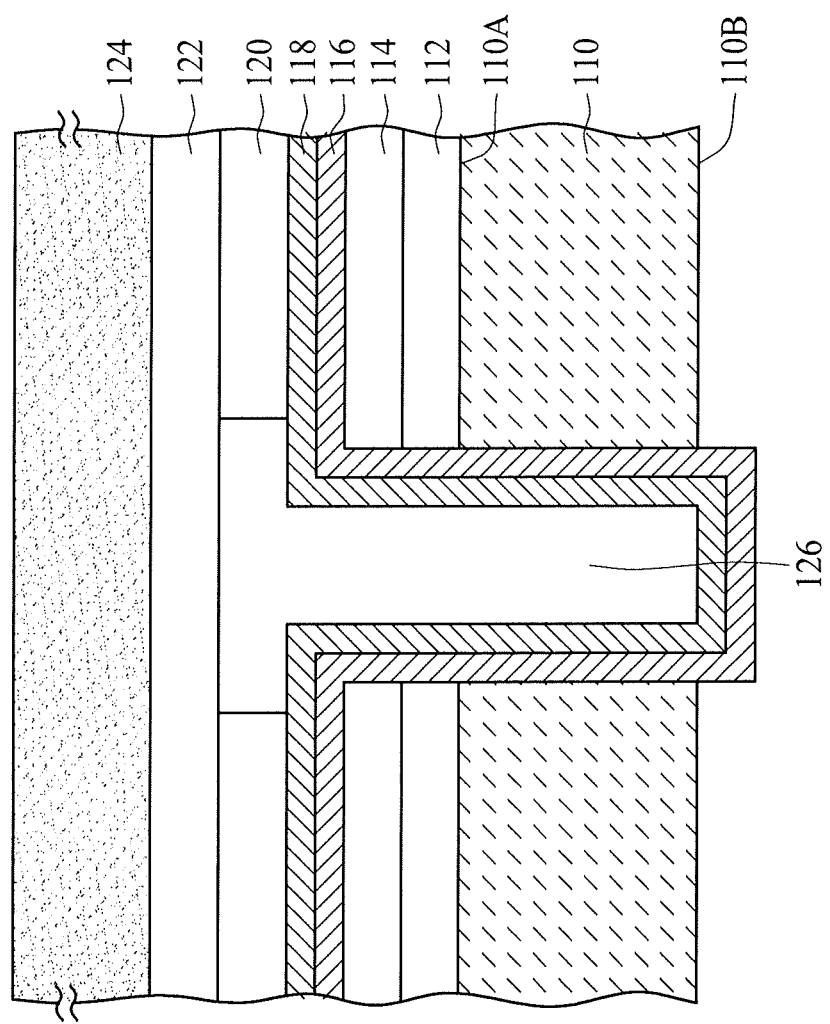

Referring to FIG. 5, according to one embodiment of the present invention, one or more wet etching processes are performed on the second side 110B of the semiconductor substrate 110 after the thinning process, thereby leaving the bottom of the hole 111, i.e., the dielectric layer 116 below the TSV 126 in this embodiment, protruding from the second side 110B of the semiconductor substrate 110. The wet etching process may be performed by solutions like KOH (potassium hydroxide), NaOH (sodium hydroxide), NH$_4$OH (ammonia hydroxide), or TMAH (tetramethylammonia hydroxide). According to another embodiment of the present invention, one or more dry etching processes are performed on the semiconductor substrate 110 after the thinning process. Therefore, the second side 110B of the semiconductor substrate 110 is etched by an anisotropic plasma etch using compounds such as HBr/O$_2$, SF6/CL$_2$, SF$_6$ plasma, or the likes.

Figure 6:
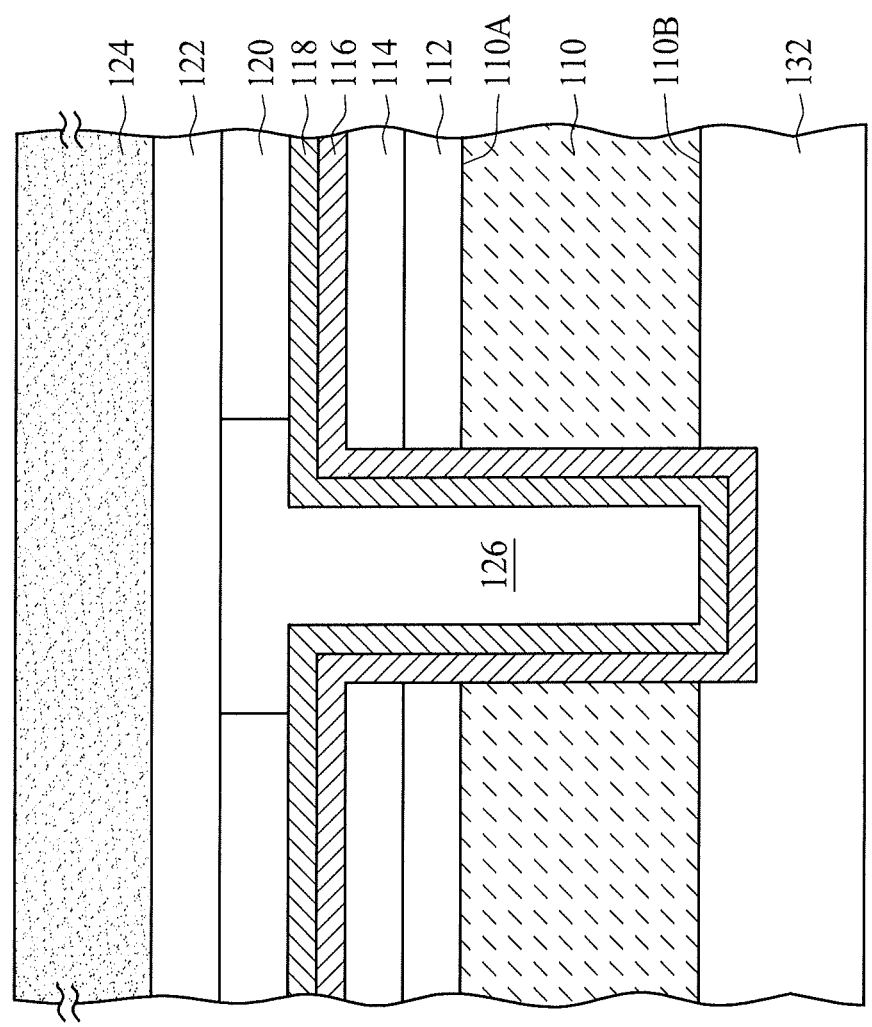
Figure 7:
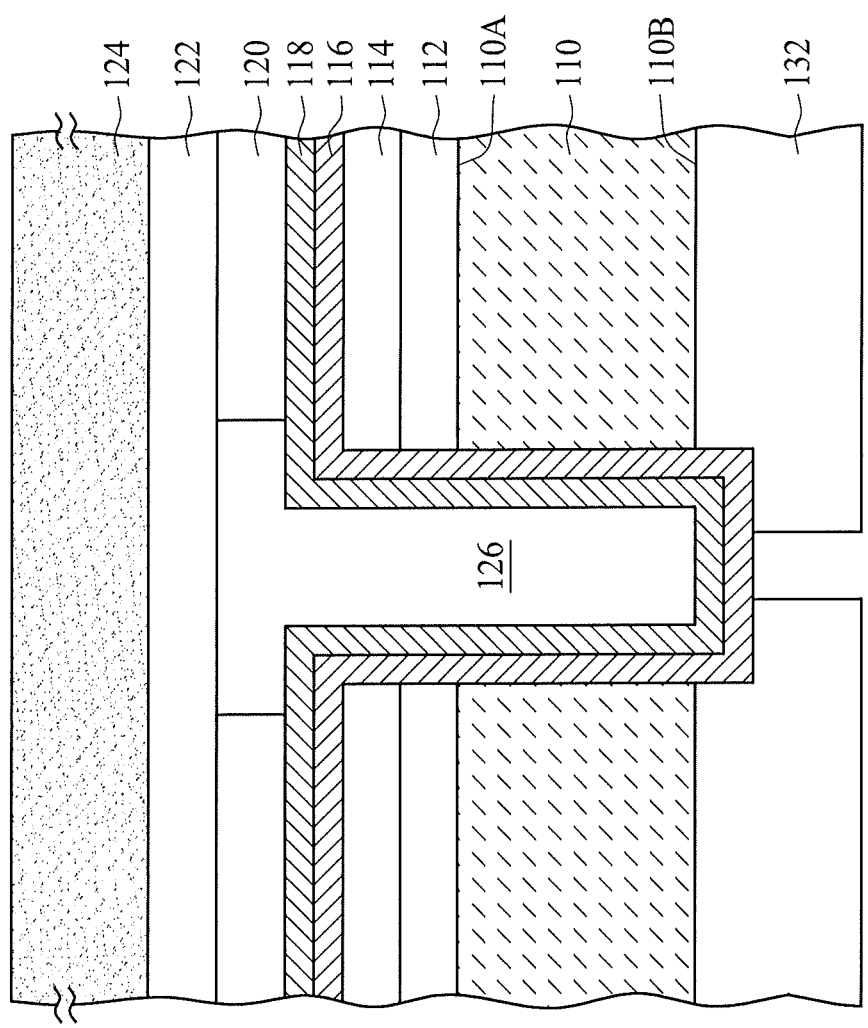

Referring to FIG. 6, a photosensitive dielectric layer 132 is formed on the second side 110B of the semiconductor substrate 110. The photosensitive dielectric layer 132 can be made of a material selected from the group consisting of polybenzoxazoles (PBO), polybenzimidazoles, polyimides (PI), phenolic resins and a combination thereof. Subsequently, a lithographic process is performed by using UV radiation to expose a potion of the photosensitive dielectric layer 132 right below the TSV 126. Depending on whether the photosensitive dielectric layer 132 is a negative tone or a positive tone photoresist, the unexposed portions or the exposed portions of the photosensitive dielectric layer 132 are then developed and removed using a solution such as TMAH, as shown in FIG. 7.

Figure 8:
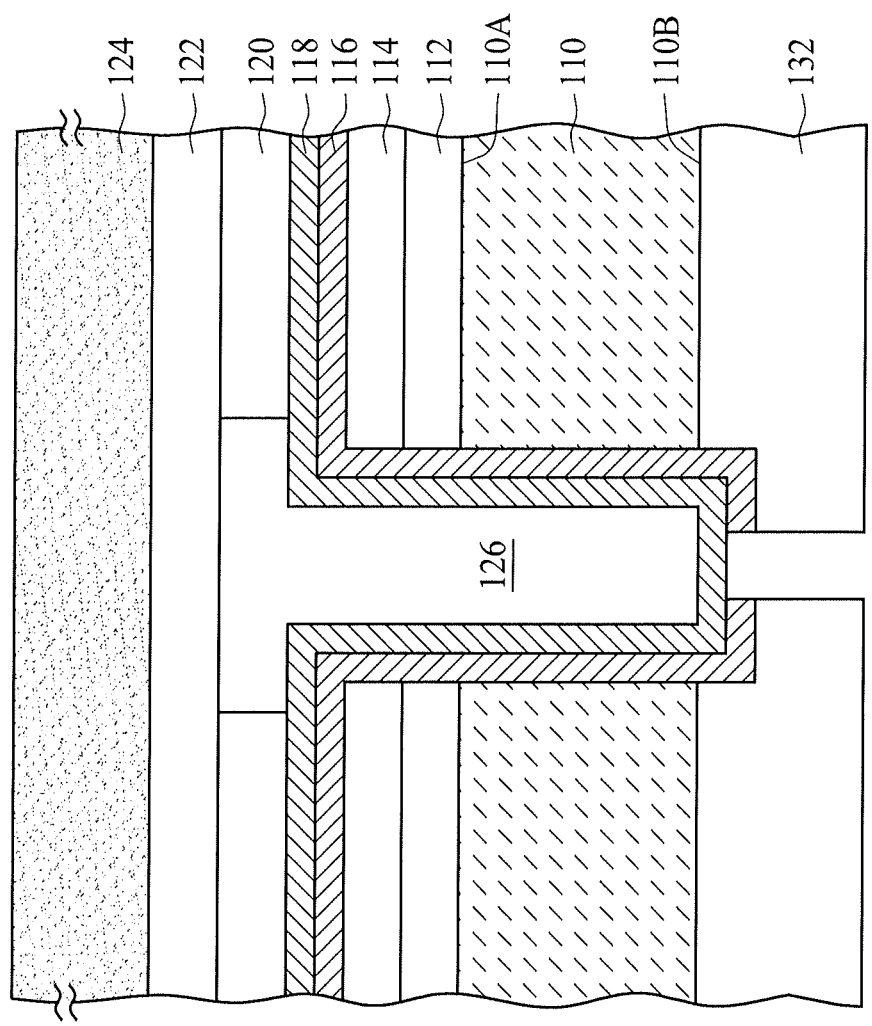
Figure 9:
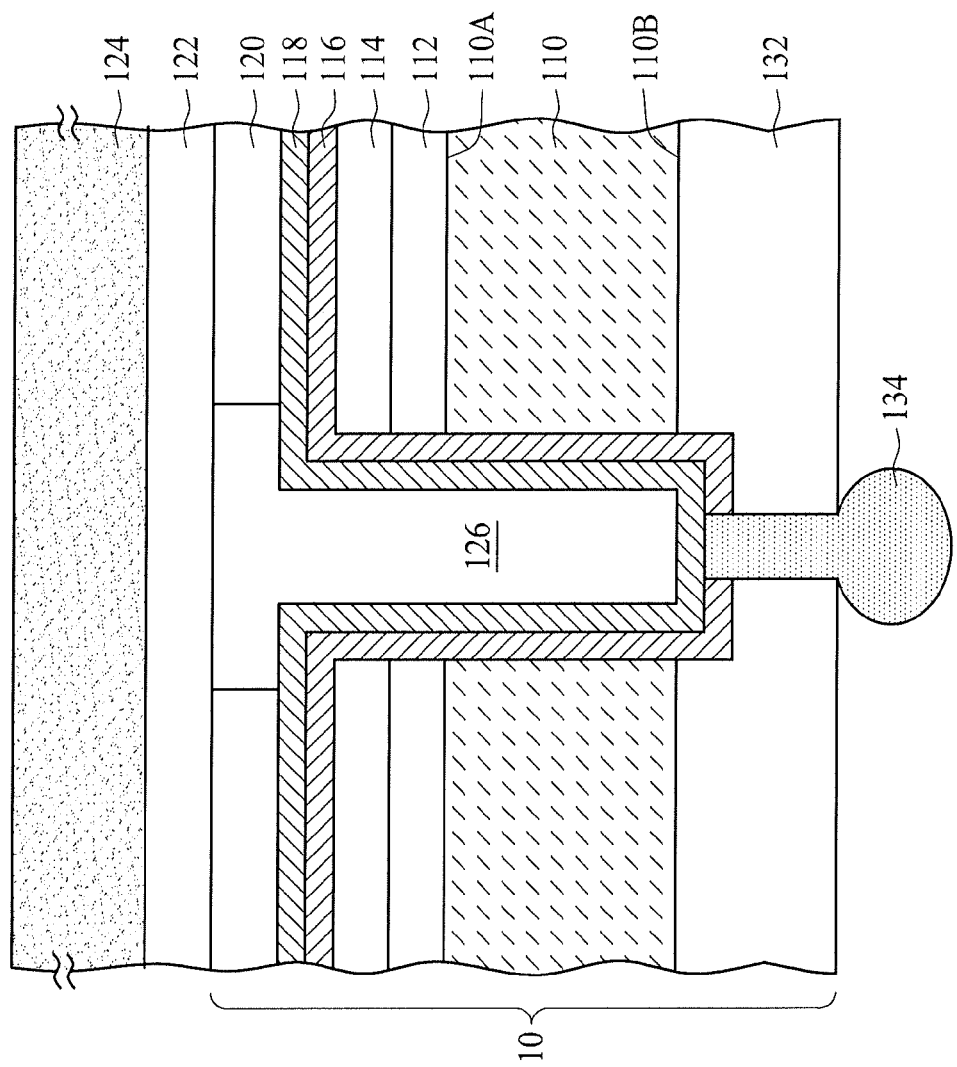

FIG. 8 illustrates an etching process to remove a portion of the dielectric layer 116 positioned below the TSV 126 in accordance with an embodiment of the present invention. After the etching process, a portion of the conductive diffusion barrier layer 118 is exposed and then a solder bump 134 can be formed to connect the exposed portion of the conductive diffusion barrier layer 118 below the TSV 126 for an external electrical connection as shown in FIG. 9. Therefore, the solder bump 134 is electrically connected to the conductive material in the hole 111. Subsequently, other back-end-of-line (BEOL) processing techniques suitable for the particular application may be performed to complete the integrated circuit structure 10. For example, the carrier 124 may be removed, an encapsulant may be formed, a dicing process may be performed to dice individual dies, wafer-level or die-level stacking, and the likes, may be performed depending on the application.

Figure 10:
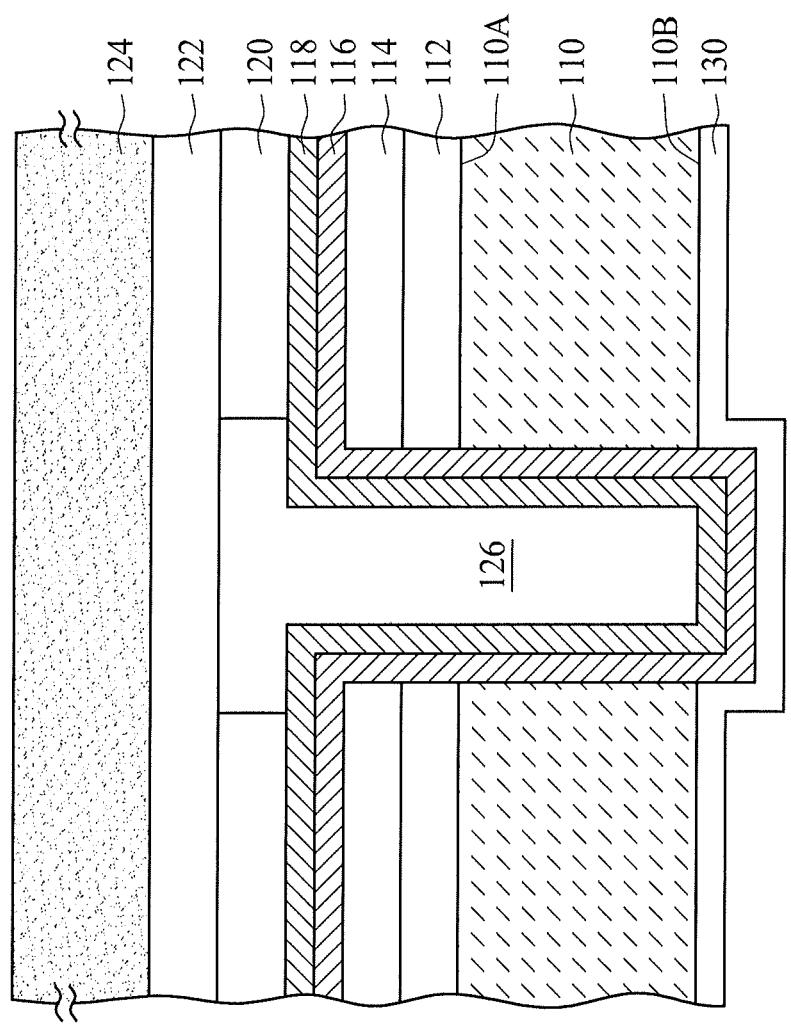

In one embodiment of the present invention, before the formation of the photosensitive dielectric layer 132, a dielectric layer 130 is optionally formed on the second side 110B of the semiconductor substrate 110 as shown in FIG. 10. Generally, the dielectric layer 130 provides a mechanism to prevent the diffusion of the conductive material in the TSV 126 and to compensate for the stress applied to the second side 110B of the semiconductor substrate 110 during subsequent processing steps. According to one embodiment, the dielectric layer 130 is deposited by CVD or PECVD techniques, and the material can be selected from the group consisting of SiN, SiCN, SiCO, CN and a combination thereof.

Although the present invention have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, to compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure, comprising:
    a semiconductor substrate having a first side and a second side opposite the first side;
    a conductive via extending from the first side of the semiconductor substrate, wherein the bottom of the conductive via protrude from the second side of the semiconductor substrate;
    a diffusion barrier layer positioned along a sidewall and a bottom surface of the conductive via;
    a first dielectric layer positioned along the diffusion barrier layer;
    a photosensitive dielectric layer formed on the second side of the semiconductor substrate, wherein the photosensitive dielectric layer has an opening; and
    a solder bump positioned in the opening and electrically connected to the conductive via,
    wherein the diffusion barrier layer is disposed between the conductive via and the solder bump, and
    wherein the conductive via, the diffusion barrier layer, and the first dielectric layer are positioned in this order.

2. The integrated circuit structure of claim 1, further comprising a second dielectric layer between the semiconductor substrate and the photosensitive dielectric layer.

3. The integrated circuit structure of claim 2, wherein the second dielectric layer is a silicon nitride layer.

4. The integrated circuit structure of claim 1, wherein the photosensitive dielectric layer is made of a material selected from the group consisting of polybenzoxazoles (PBO), polybenzimidazoles, polyimides (PI), phenolic resins and a combination thereof.

\* \* \* \* \*